United States Patent
Basker et al.

(10) Patent No.: US 10,622,379 B2
(45) Date of Patent: Apr. 14, 2020

(54) STRUCTURE AND METHOD TO FORM DEFECT FREE HIGH-MOBILITY SEMICONDUCTOR FINS ON INSULATOR

(71) Applicant: International Business Machines Corporation, Armonk, NY (US)

(72) Inventors: Veeraraghavan S. Basker, Schenectady, NY (US); Oleg Gluschenkov, Tannersville, NY (US); Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/940,487

(22) Filed: Mar. 29, 2018

(65) Prior Publication Data

US 2018/0219026 A1    Aug. 2, 2018

Related U.S. Application Data

(62) Division of application No. 15/134,083, filed on Apr. 20, 2016, now Pat. No. 9,941,302.

(51) Int. Cl.

| | |
|---|---|
| *H01L 27/12* | (2006.01) |
| *H01L 29/06* | (2006.01) |
| *H01L 29/161* | (2006.01) |
| *H01L 29/20* | (2006.01) |
| *H01L 21/84* | (2006.01) |
| *H01L 21/762* | (2006.01) |
| *H01L 21/3105* | (2006.01) |

(Continued)

(52) U.S. Cl.
CPC .... *H01L 27/1211* (2013.01); *H01L 21/02381* (2013.01); *H01L 21/02488* (2013.01); *H01L 21/02532* (2013.01); *H01L 21/02538* (2013.01); *H01L 21/31051* (2013.01); *H01L 21/7624* (2013.01); *H01L 21/845* (2013.01); *H01L 29/0649* (2013.01); *H01L 29/1054* (2013.01); *H01L 29/161* (2013.01); *H01L 29/20* (2013.01); *H01L 29/517* (2013.01); *H01L 29/518* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | |
|---|---|---|
| 8,304,817 B2 | 11/2012 | Tezuka et al. |
| 8,389,347 B2 | 3/2013 | Tezuka et al. |

(Continued)

OTHER PUBLICATIONS

List of IBM Patents or Patent Applications Treated as Related dated Mar. 29, 2018, 2 pages.

*Primary Examiner* — Long Pham
(74) *Attorney, Agent, or Firm* — Scully, Scott, Murphy & Presser, P.C.; Daniel P. Morris, Esq.

(57) ABSTRACT

A semiconductor structure is provided that includes a plurality of high mobility semiconductor material (i.e., silicon germanium alloy of III-V compound semiconductors) fins located above and spaced apart from a bulk semiconductor substrate portion, wherein each of the high mobility semiconductor material fins has a lower faceted surface that is confined within a dielectric isolation structure.

18 Claims, 6 Drawing Sheets

(51) Int. Cl.
*H01L 21/02* (2006.01)
*H01L 29/51* (2006.01)
*H01L 29/78* (2006.01)
*H01L 29/66* (2006.01)
*H01L 29/10* (2006.01)

(56) References Cited

U.S. PATENT DOCUMENTS

| | | | |
|---|---|---|---|
| 8,828,823 B2 * | 9/2014 | Liu | H01L 29/66795 |
| | | | 257/288 |
| 8,872,225 B2 | 10/2014 | Chu-Kung et al. | |
| 8,889,561 B2 | 11/2014 | Woo et al. | |
| 9,105,510 B2 | 8/2015 | Woo et al. | |
| 2017/0125525 A1 * | 5/2017 | Fung | H01L 29/7849 |

* cited by examiner

STRUCTURE AND METHOD TO FORM DEFECT FREE HIGH-MOBILITY SEMICONDUCTOR FINS ON INSULATOR

BACKGROUND

The present application relates to a semiconductor structure and a method of forming the same. More particularly, the present application relates to a semiconductor structure including high mobility semiconductor material fins having a faceted bottom surface which is present in a dielectric material and a method of forming the same.

The use of non-planar semiconductor devices such as, for example, silicon fin field effect transistors (FinFETs) is the next step in the evolution of complementary metal oxide semiconductor (CMOS) devices. Silicon fin field effect transistors (FETs) can achieve higher drive currents with increasingly smaller dimensions as compared to conventional planar FETs. In order to extend these devices for multiple technology nodes such as, for example, 10 nm and beyond, there is a need to boost the performance with high-mobility channels.

In such FinFET devices, fins containing a silicon germanium alloy or a III-V compound semiconductor are examples of promising channel materials because of their high-carrier mobility which enhances device performance at smaller device sizes. Formation of such high channel mobility fins is challenging due to the lattice mismatch of those semiconductor materials with silicon. Typically, silicon germanium alloy fins (or III-V compound semiconductor fins) are formed by epitaxially growing a layer of silicon germanium alloy or a III-V compound semiconductor on a bulk silicon substrate. The layer of silicon germanium alloy or III-V compound semiconductor is then patterned utilizing extreme ultraviolet (EUV) lithography. The use of EUV lithography is an expensive method to form high channel mobility fins having tight fin pitches.

Also, disconnecting high channel mobility fins from the bulk silicon substrate to create a fin-on-insulator structure has many device performance enhancing benefits such as, for example, lower leakage. Creating such structures via wafer bonding and fin cutting is very expensive and works only on the whole substrate, but not only in selected regions of the substrate.

As such, there is a need for providing high channel mobility fin-on-insulator structures which avoids the need to use EUV lithography to define the fins, and wafer bonding and fin cutting to disconnect the fins from the bulk substrate.

SUMMARY

In one aspect of the present application, a semiconductor structure is provided. In one embodiment of the present application, the semiconductor structure includes a plurality of high mobility semiconductor material fins located above and spaced apart from a bulk semiconductor substrate portion, wherein each of the high mobility semiconductor material fins has a lower faceted surface that is confined within a dielectric isolation structure.

In another aspect of the present application, a method of forming a semiconductor structure is provided. In one embodiment of the present application, the method includes forming at least one semiconductor fin extending upwards from a remaining portion of a bulk semiconductor substrate. A first dielectric material portion comprising a first dielectric material is formed on a surface of the remaining portion of the bulk semiconductor substrate and at a lower portion of the at least one semiconductor fin. Next, a high mobility semiconductor material structure is epitaxially grown from exposed sidewall surfaces of the at least one semiconductor fin, each high mobility semiconductor material structure having a faceted upper surface and a faceted lower surface. A second dielectric material is formed surrounding the at least one semiconductor fin and each high mobility semiconductor material structure, wherein the lower faceted surface of each high mobility semiconductor material fin is confined within a lower portion of the second dielectric material. An upper portion of the second dielectric material and an upper portion of the at least one semiconductor fin are then planarized, wherein during the planarizing the faceted upper surface of each high mobility semiconductor material structure is removed to provide high mobility semiconductor material fins having the lower faceted surface. Next, the remaining portion of the at least one semiconductor fin is partially removed to provide a gap between each high mobility semiconductor material fin. A third dielectric material is then formed atop each high mobility semiconductor fin and within the gap, and thereafter a portion of the third dielectric material and a remaining portion of the second dielectric material are recessed to expose sidewall surfaces and a topmost surface of each high mobility semiconductor fin, wherein the lower faceted surface of each of the high mobility semiconductor material fins is embedded within a lower portion of the remaining portion of the second dielectric material.

DETAILED DESCRIPTION

Figure 1:
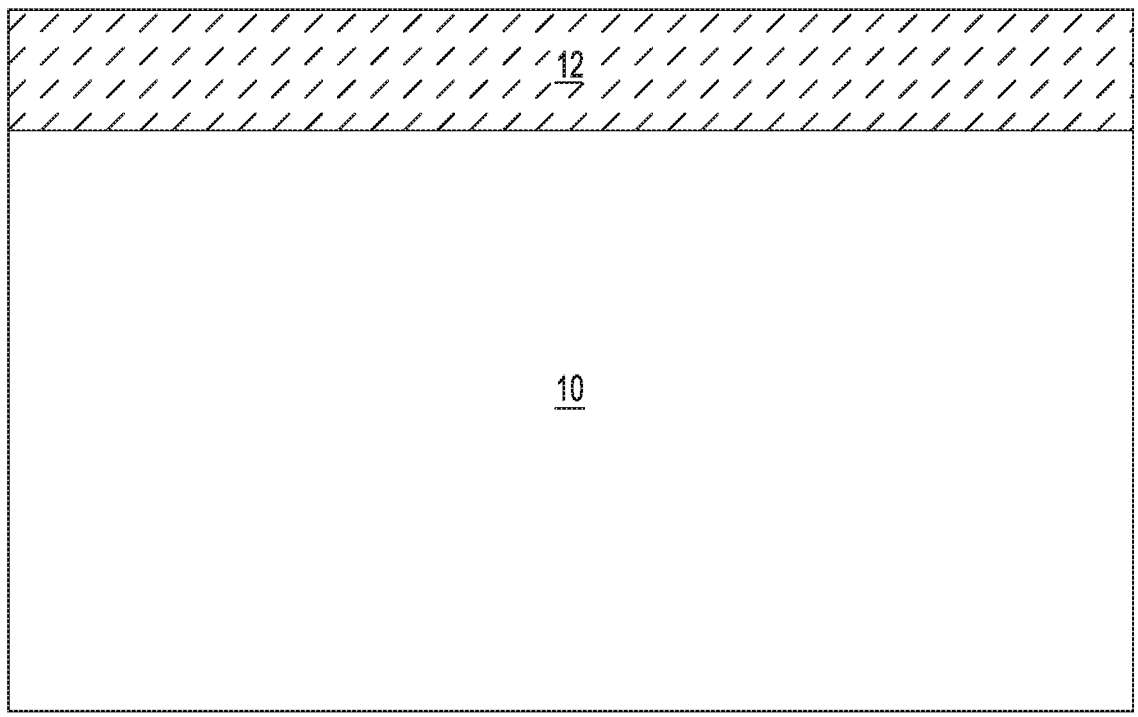
FIG. 1 is a cross sectional view of an exemplary semiconductor structure including, from bottom to top, a bulk semiconductor substrate and a hard mask layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including, from bottom to top, a bulk semiconductor substrate 10 and a hard mask layer 12 that can be employed in accordance with an embodiment of the present application The term "bulk semiconductor substrate" denotes a substrate that is entirely composed of at least one semiconductor material having semiconducting properties; no insulator material and/or conductive material is present in a bulk semiconductor substrate.

The semiconductor material(s) that provide the bulk semiconductor substrate 10 may include silicon (Si), germanium (Ge), silicon germanium (SiGe) alloys, III-V compound semiconductors, or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one embodiment, the bulk semiconductor substrate 10 is composed entirely of silicon.

The semiconductor material or materials that provide(s) the bulk semiconductor substrate 10 may have any of the well known crystal orientations. For example, the crystal orientation of the bulk semiconductor substrate 10 may be {100}, {110}, or {111}. Other crystallographic orientations besides those specifically mentioned can also be used in the present application. At least an upper portion of the bulk semiconductor substrate which is subsequently processed into the at least one semiconductor fin 10F is single crystalline.

The hard mask layer 12 is a continuous layer that covers an entirety of the topmost surface of the bulk semiconductor substrate 10. The hard mask layer 12 may be composed of any hard mask material including, for example, a dielectric oxide, dielectric nitride and/or a dielectric oxynitride. In some embodiments of the present application, the hard mask material that provides the hard mask layer 12 is composed of silicon nitride and/or silicon oxynitride.

In one embodiment of the present application, the hard mask material that provides the hard mask layer 12 may be formed utilizing a deposition process such as, for example, chemical vapor deposition or plasma enhanced chemical vapor deposition. In another embodiment of the present application, the hard mask material that provides the hard mask layer 12 may be formed utilizing a thermal growth process such as, for example, thermal oxidation or thermal nitridation. In yet another embodiment, any combination of a deposition process and/or a thermal process may be used in providing the hard mask material that provides the hard mask layer 12. The hard mask layer 12 may, in some embodiments, have a thickness from 20 nm to 50 nm. Other thicknesses that are lesser than, or greater than, the range provide may also be used in the present application for the thickness of the hard mask layer 12.

Figure 2:
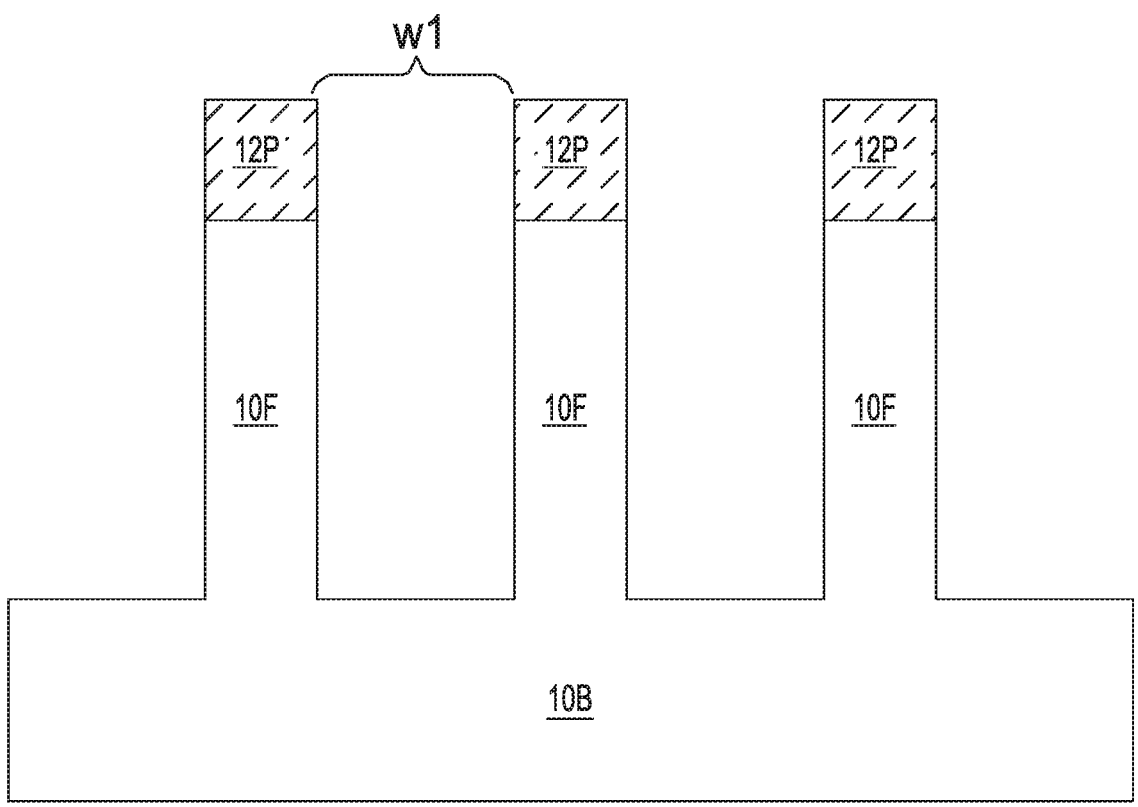
FIG. 2 is a cross sectional view of the exemplary semiconductor structure of FIG. 1 after performing a patterning process to form at least one semiconductor fin extending upwards from a remaining portion of the bulk semiconductor substrate, wherein the at least one semiconductor fin is capped with a hard mask layer portion.

Referring now to FIG. 2, there is illustrated the exemplary semiconductor structure of FIG. 1 after performing a patterning process to form at least one semiconductor fin 10F extending upwards from a remaining portion of the bulk semiconductor substrate (hereinafter bulk semiconductor substrate portion 10B), wherein the at least one semiconductor fin 10F is capped with a hard mask layer portion 12P; each hard mask layer portion 12P represents a remaining portion of the hard mask layer 12.

In the drawings, three semiconductor fins 10F are shown by way of one example. The number of semiconductor fins 10F that are formed at this point of the present application may vary so long as at least one semiconductor fin 10F is formed. As is shown, the sidewall surfaces of each hard mask layer portion 12P are vertically aligned with the sidewall surfaces of a corresponding and underlying semiconductor fin 10F.

In one embodiment, the patterning process used to define the least one semiconductor fin 10F may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. In the present application, the etch stops within a portion of the bulk semiconductor substrate 10.

In another embodiment, the patterning process may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer on each sidewall of each mandrel structure. The spacer which can be composed of any material that has a different etch selectivity than the mandrel material can be formed by deposition of a spacer material and then etching the deposited spacer material. In one example, the spacer material may be composed of any dielectric spacer material such as, for example, silicon dioxide, silicon nitride or a dielectric metal oxide. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching. After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet another embodiment, the patterning process may include a direct self-assembly (DSA) patterning process.

As used herein, a "fin" refers to a contiguous semiconductor material, and including a pair of vertical sidewalls that are parallel to each other. As used herein, a surface is "vertical" if there exists a vertical plane from which the surface does not deviate by more than three times the root mean square roughness of the surface. In one embodiment of the present application, each semiconductor fin 10F may have a width from 4 nm to 30 nm; the height of each semiconductor fin 10F may be from 10 nm to 150 nm. Other widths and heights that are lesser than, or greater than the ranges mentioned herein can also be used in the present application. Each semiconductor fin 10F can be separated by a gap that has a width, w1, from 20 nm to 50 nm.

Figure 3:
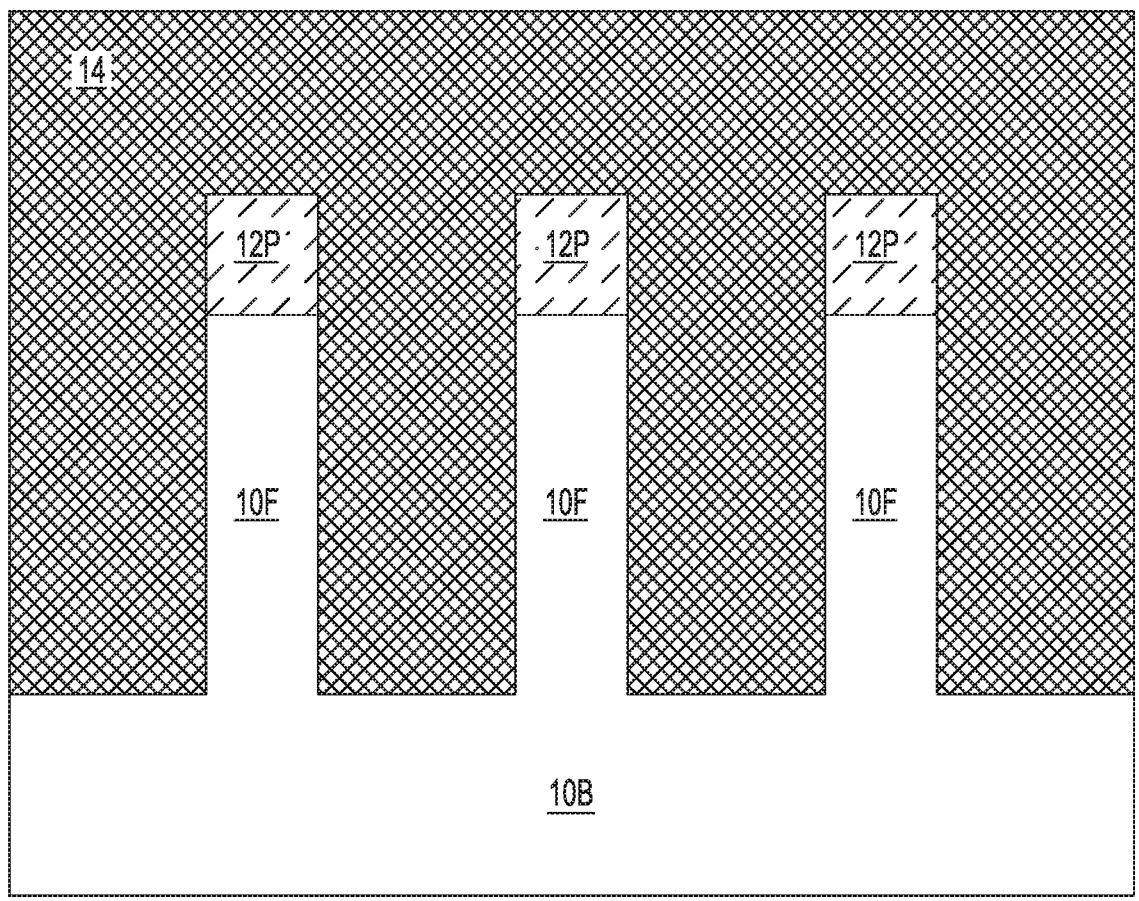
FIG. 3 is a cross sectional view of the exemplary semiconductor structure of FIG. 2 after forming a first dielectric material.

Referring now to FIG. 3, there is illustrated the exemplary semiconductor structure of FIG. 2 after forming a first dielectric material 14. As is shown, the first dielectric material 14 is formed so as to surround the exposed surfaces of each semiconductor fin 10F and to present above each hard mask layer portion 12P. As is also shown, a bottommost surface of the first dielectric material 14 is formed in direct contact with exposed surfaces of the bulk semiconductor substrate portion 10B.

The first dielectric material 14 includes any dielectric material that has a different composition that the hard mask material that provides the hard mask layer 12 and thus each hard mask layer portion 12P. In one embodiment of the present application, the first dielectric material 14 is composed of silicon dioxide. The first dielectric material may be formed utilizing a deposition process such as, for example, chemical vapor deposition or plasma enhanced chemical vapor deposition. The thickness of the first dielectric material 14 may vary so long as the thickness of the first dielectric material 14 is greater than the combined thickness of each semiconductor fin 10F/hard mask layer portion 12P material stack.

Figure 4:
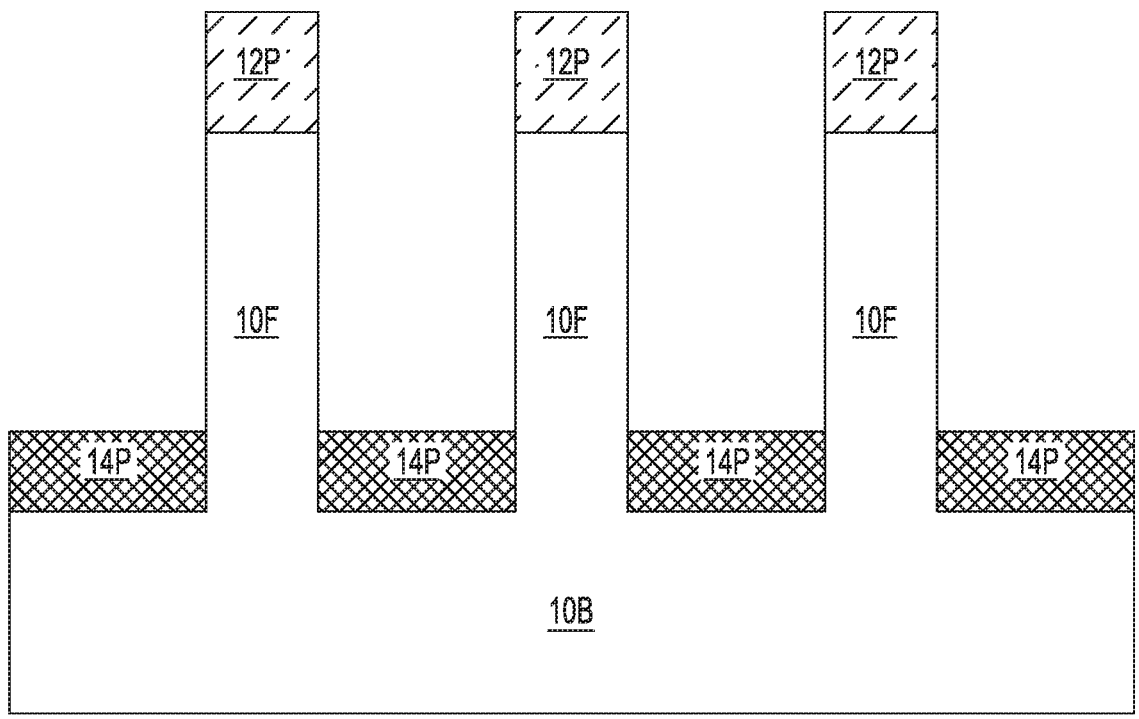
FIG. 4 is a cross sectional view of the exemplary semiconductor structure of FIG. 3 after recessing the first dielectric material.

Referring now to FIG. 4, there is illustrated the exemplary semiconductor structure of FIG. 3 after recessing the first dielectric material 14; each remaining portion of the first dielectric material 14 is hereinafter referred to as a first dielectric material portion 14P. As is shown, each first dielectric material portion 14P has a topmost surface that is located beneath the topmost surface of each semiconductor fin 10F. As is further shown, each first dielectric material portion 14P is located adjacent a bottom portion of each semiconductor fin 10F and thus protects a lower portion of each sidewall surface of each semiconductor fin 10F. The remaining sidewall surfaces of each semiconductor fin 10F are exposed.

The recessing of the first dielectric material 14 may include etching alone, or a combination of a planarization process, followed by an etch. When such an embodiment is employed, a planarization process such as, for example, chemical mechanical polishing removes a portion of the first dielectric material such that a planarized first dielectric material structure (not shown) is provided that has a topmost surface that is coplanar with a topmost surface of each hard mask layer portion 12P (in this instance, each hard mask layer portion 12P functions as a planarization stop layer). The planarized first dielectric material structure is then etched to provide the first dielectric material portions 14P shown in FIG. 4.

The etch that is used alone, or in combination with the planarization process, is any etch that selectively removes the dielectric material that provides the first dielectric material 14 relative to the hard mask material that provides the hard mask layer portions 12P and the semiconductor material that provides the semiconductor fins 10F. In embodiments when the first dielectric material is composed of silicon dioxide, hydrofluoric acid or a buffered oxide etch (i.e., ammonium fluoride and hydrofluoric acid) may be used.

Each first dielectric material portion 14P that is formed may have a height that is from 10 nm to 30 nm. Other heights are possible and are not excluded as long as the height of each first dielectric material portion 14P does not cover an upper portion of each sidewall surface of each semiconductor fin 10F.

Figure 5:
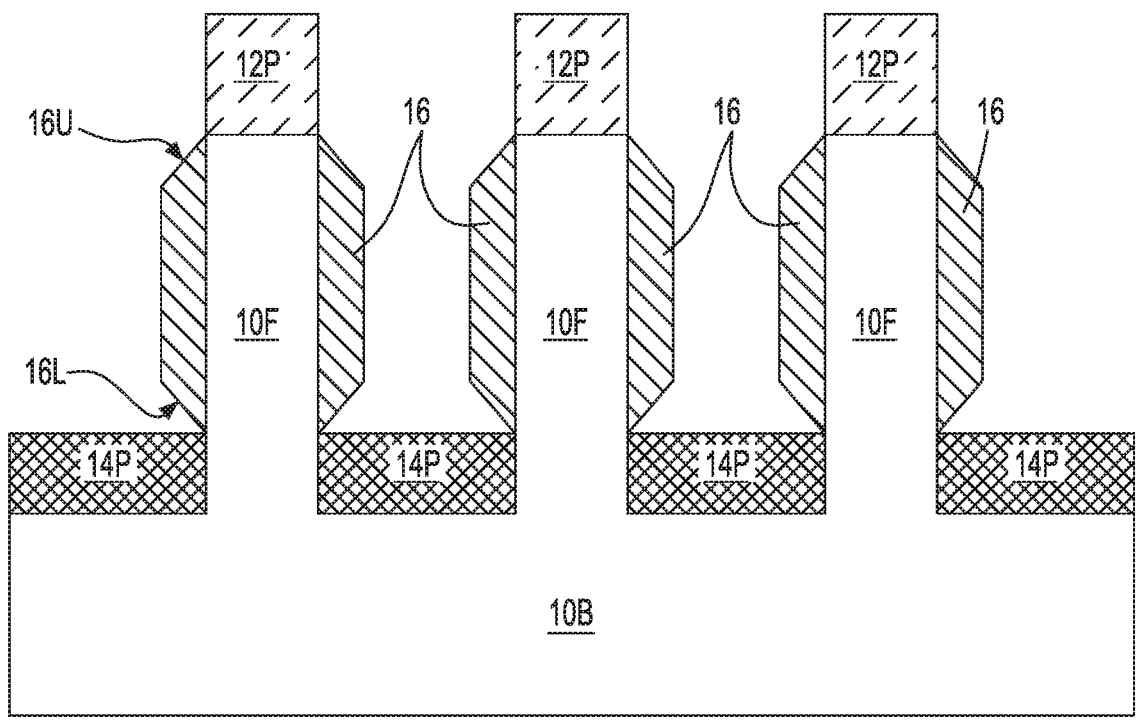
FIG. 5 is a cross sectional view of the exemplary semiconductor structure of FIG. 4 after epitaxially growing a high mobility semiconductor material structure from each exposed sidewall surface of the at least one semiconductor fin.

Referring now to FIG. 5, there is illustrated the exemplary semiconductor structure of FIG. 4 after epitaxially growing a high mobility semiconductor material structure 16 from each exposed sidewall surface of the at least one semiconductor fin 10F. As is shown, a pair of high mobility semiconductor material structures 16 is formed from each semiconductor fin 10F.

Each high mobility semiconductor material structure 16 is composed of a semiconductor material that differs from the semiconductor material of the semiconductor fins 16F. Also, each high mobility semiconductor material structure is composed of a semiconductor material that has a higher carrier (i.e., electron or hole) mobility than the semiconductor material of the semiconductor fins 10F. That is, each high mobility semiconductor material structure 16 is composed of a semiconductor material in which electrons or holes move through the semiconductor material more quickly than the semiconductor material that provides the semiconductor fins 16F. For example, when the semiconductor fins 10F are composed silicon, each high mobility semiconductor material structure 16 is composed of a silicon germanium alloy or a III-V compound semiconductor.

Each high mobility semiconductor material structure 16 is epitaxially grown outward from the exposed sidewall surfaces of each semiconductor fin 10F. Each high mobility semiconductor material structure 16 has a faceted upper surface 16U and a faceted lower surface 16L. By "faceted" is it meant that the upper and lower surfaces are not parallel with the horizontal topmost surface of the underlying bulk semiconductor substrate portion 10B. In the present application, and as shown, a gap remains between the sidewall surfaces of the high mobility semiconductor material structures 16 that are formed from a pair of neighboring semiconductor fins 10F. Thus, no merging of the high mobility semiconductor material structures 16 occurs.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Since an epitaxial growth process is used in providing each high mobility semiconductor material structure 16, the high mobility semiconductor material structures 16 have an epitaxial relationship with the sidewall surfaces of the semiconductor fins 10F.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of each high mobility semiconductor material structure 16 can be performed utilizing any well known precursor gas or gas mixture. Carrier gases like hydrogen, nitrogen, helium and argon can be used.

Each high mobility semiconductor material structure 16 can have a thickness, as measured from a sidewall surface that directly contacts the exposed sidewall surface of a semiconductor fin 10F to an outermost sidewall that is furthest from the sidewall surface directly contacting the semiconductor fin 10F, from 5 nm to 15 nm. The height of each high mobility semiconductor material structure 16, as measured vertically along the sidewall surface that directly contacts the exposed sidewall surface of the semiconductor fin 10F, can be in a range from 20 nm to 100 nm.

Each high mobility semiconductor material structure 16 (and the corresponding high mobility semiconductor material fins to be subsequently formed) is defect free. By "defect free" it is meant a defect density of less than 100 defects per square centimeter.

Figure 6:
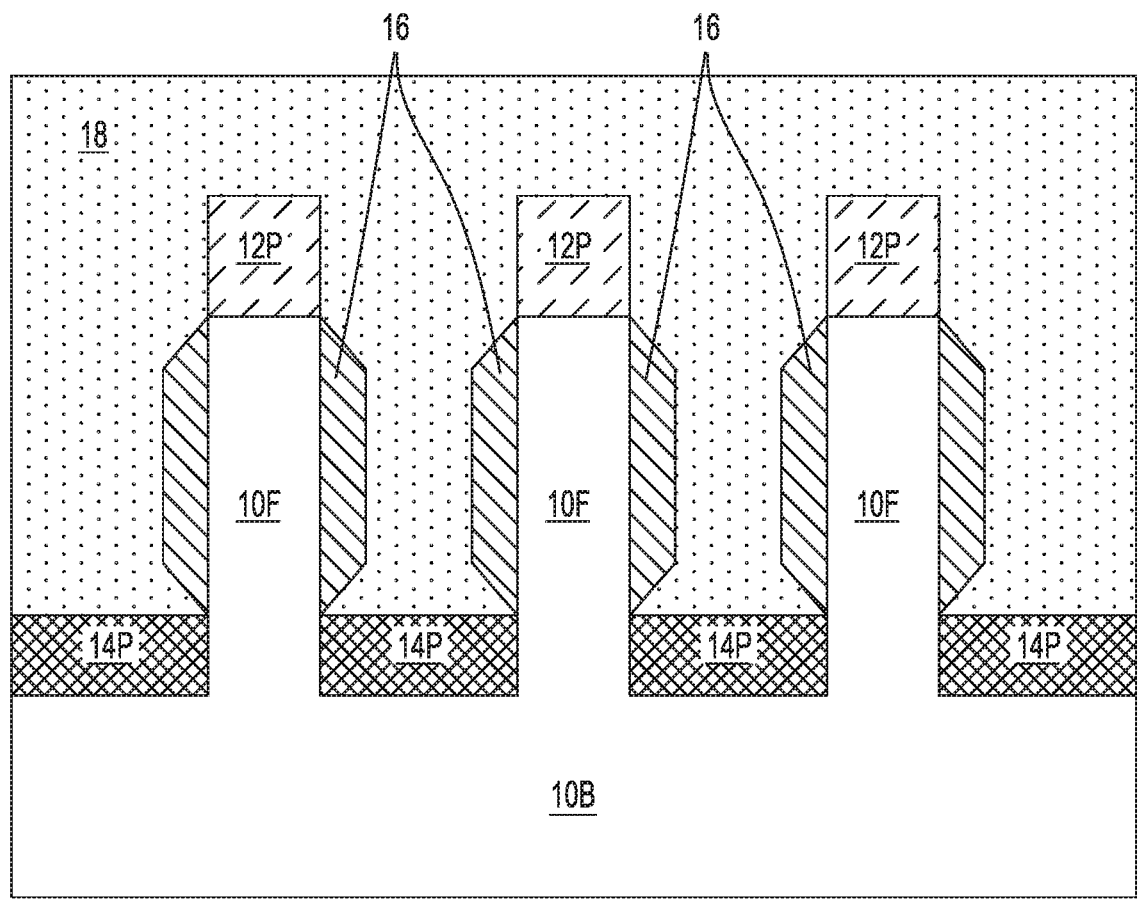
FIG. 6 is a cross sectional view of the exemplary semiconductor structure of FIG. 5 after forming a second dielectric material.

Referring now to FIG. 6, there is illustrated the exemplary semiconductor structure of FIG. 5 after forming a second dielectric material 18. As is shown, the second dielectric material 18 is formed so as to surround each high mobility semiconductor material structure 16 and each semiconductor fin 10F as well as to be present above each hard mask layer portion 12P. As is also shown, a bottommost surface of the third dielectric material 18 is formed in direct contact with exposed topmost surface of the first dielectric material portions 14P.

The second dielectric material 18 includes any dielectric material. In one embodiment, the second dielectric material 18 is composed of one of the dielectric materials mentioned above for the first dielectric material 14. In such an embodiment, the second dielectric material 18 may be composed of a same dielectric material as the first dielectric material 14. Also, and in such an embodiment, the second dielectric material 18 may be composed of a different dielectric material than the first dielectric material 14. In some embodiments, the second dielectric material 18 may be composed of a doped oxide such as, for example, boron doped silicate glass (BSG) or arsenic doped silicate glass (ASG). The doped oxide materials may be used as punch-through stop layer.

The second dielectric material 18 may be formed by a deposition process including, for example, chemical vapor deposition, plasma enhanced chemical vapor deposition or spin-on coating. The thickness of the second dielectric material 18 may vary so long as the thickness of the second dielectric material 18 is greater than the combined thicknesses of each semiconductor fin 10F/hard mask layer portion 12P material stack.

Figure 7:
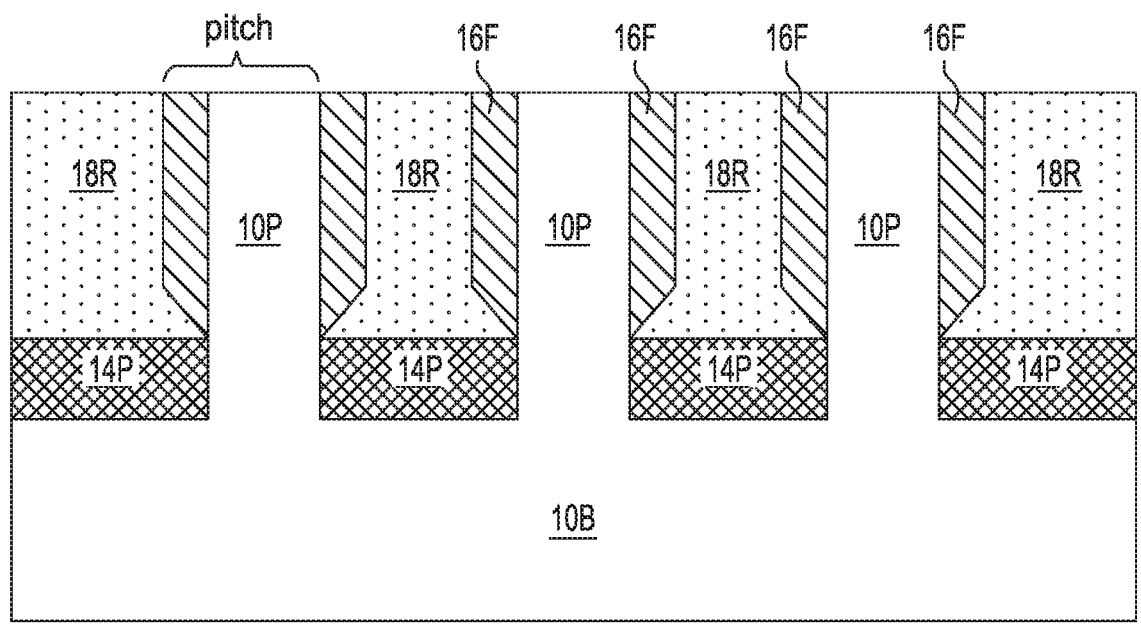
FIG. 7 is a cross sectional view of the exemplary semiconductor structure of FIG. 6 after performing a planarization process to remove an upper faceted surface of each high mobility semiconductor material structure.

Referring now to FIG. 7, there is illustrated the exemplary semiconductor structure of FIG. 6 after performing a planarization process such as, for example, chemical mechanical polishing and/or grinding, to remove the upper faceted surface 16U of each high mobility semiconductor material structure 16 and to provide a high mobility semiconductor material fin 16F; each high mobility semiconductor material fin 16F still contains the lower faceted surface 16L which is present in a remaining portion of the second dielectric material. The remaining portion of the second dielectric material 18 is referred to herein as a second dielectric material structure 18R.

In addition to removing the upper faceted surface 16U of each high mobility semiconductor material structure 16, the planarization process also removes an upper portion of the second dielectric material 18, each hard mask portion 12P and an upper portion of each semiconductor fin 10F. The remaining portion of each semiconductor fin 10F is now referred to herein as a semiconductor fin portion 10P.

As is illustrated in the drawings, a first sidewall surface of each high mobility semiconductor material fin 16F has a length that is greater than a length of second sidewall surface of each high mobility semiconductor material fin 16F, wherein the second sidewall surface is opposite the first sidewall surface. In accordance with the present application, the fin pitch (i.e., the distance between one sidewall of a first fin to a corresponding sidewall of a neighboring fin, as shown in FIG. 7) is 30 nm or less. In one embodiment, the fin pitch is from 10 nm to 25 nm.

After planarization and as shown in FIG. 7, topmost surfaces of each second dielectric material structure 18R, each high mobility semiconductor material fin 16F and each semiconductor fin portion 10P are coplanar with each other.

Figure 8:
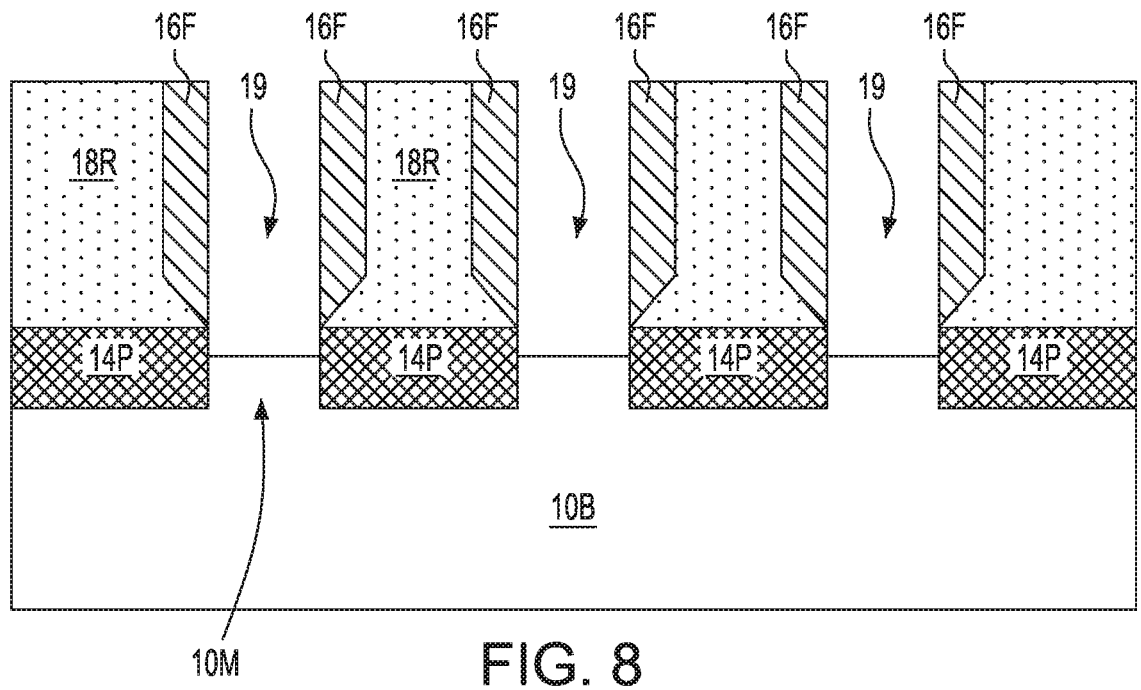
FIG. 8 is a cross sectional view of the exemplary semiconductor structure of FIG. 7 after partially removing a remaining portion of the at least one semiconductor fin.

Referring now to FIG. 8, there is illustrated the exemplary semiconductor structure of FIG. 7 after partially removing a remaining portion of the at least one semiconductor fin (i.e., the at least one semiconductor fin portion 10P). As shown, an opening 19 is formed between each pair of high mobility semiconductor material fins 16F that were present on opposing sidewall surfaces of a semiconductor fin portion 10P.

Each semiconductor fin portion 10P is partially removed utilizing an etch that is selective in removing the semiconductor material that provides each semiconductor fin 10F relative to dielectric material and the semiconductor material that provides each high mobility semiconductor material 16. In one embodiment, and when silicon is used as the semiconductor material of the semiconductor fin 10F, potassium hydroxide or tetramethylammonium hydroxide may be used to remove the silicon fins.

As is shown, a lower portion of each semiconductor fin 10F remains in the exemplary semiconductor. The remaining lower portion of each semiconductor fin 10F can be referred to herein as a semiconductor mesa surface 10M of the bulk semiconductor substrate portion 10B. As can be seen, one sidewall surface of each high mobility semiconductor fin 16P (i.e., the first sidewall surface whose length is greater than the second sidewall surface) is vertically aligned with a sidewall surface of the semiconductor mesa surface 10M. As is further illustrated, a pair of high mobility semiconductor material fins 16F is associated with each semiconductor mesa surface 10M.

Figure 9:
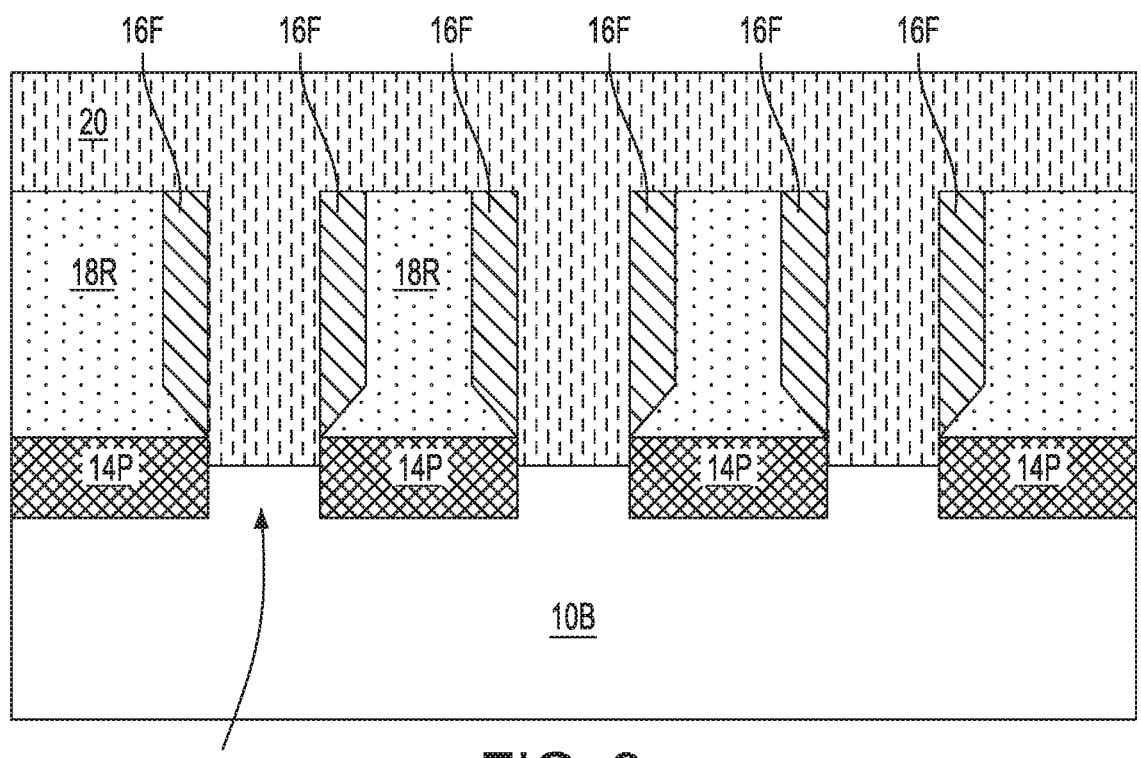
FIG. 9 is a cross sectional view of the exemplary semiconductor structure of FIG. 8 after forming a third dielectric material.

Referring now to FIG. 9, there is illustrated the exemplary semiconductor structure of FIG. 8 after forming a third dielectric material 20. The third dielectric material 20 is formed on the topmost surfaces of each second dielectric material structure 18R and each high mobility semiconductor material fin 16F and within each opening 19.

The third dielectric material 20 may be composed of any dielectric material including a dielectric material as mentioned above for the first dielectric material 14 or the second dielectric material 18. The third dielectric material 20 may be the same as, or different from, the dielectric material that provides the first dielectric material 14 and/or the second dielectric material 18. In one embodiment, a dielectric oxide such as, silicon dioxide, is used for the dielectric material of the first, second and third dielectric materials. The third dielectric material 20 may be formed utilizing a deposition process such as those mentioned above in forming the first dielectric material 14 or second dielectric material 18.

Figure 10:
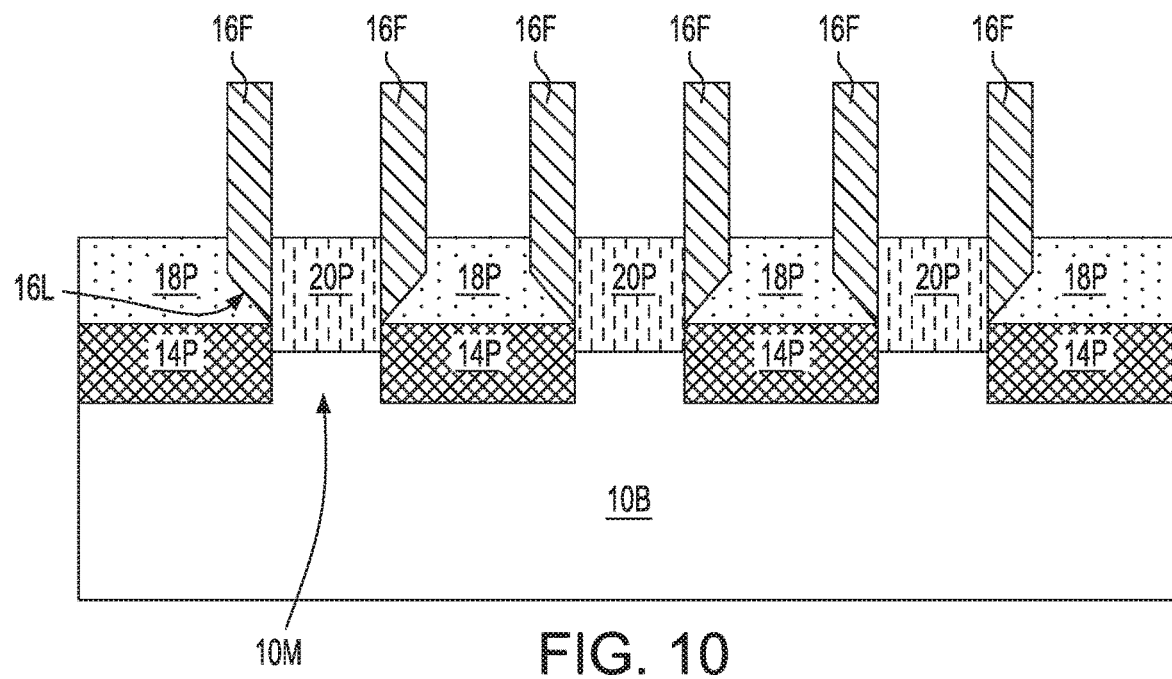
FIG. 10 is a cross sectional view of the exemplary semiconductor structure of FIG. 9 after exposing portions of the sidewall surfaces and a topmost surface of each remaining high mobility semiconductor material structure.

Referring now to FIG. 10, there is illustrated the exemplary semiconductor structure of FIG. 9 after exposing portions of the sidewall surfaces and a topmost surface of each remaining high mobility semiconductor material structure (i.e., each high mobility semiconductor material fin 16F). The exposing portions of the sidewall surfaces and a topmost surface of each high mobility semiconductor material fin 16F may be performed utilizing one or more etching processes that is(are) selective in removing dielectric material relative to the semiconductor material that provides each high mobility semiconductor material fin 16F.

As is shown, the lower faceted surface 16L of each high mobility semiconductor material fin 16F is present in a remaining portion of one of the second dielectric material structures 18R. Each remaining portion of the second dielectric material structures 18R is now referred to herein as a second dielectric material portion 18P. As is further shown, a portion of the third dielectric material 20 remains in the opening and is present directly upon the semiconductor mesa surface 10M. Each remaining portion of the third dielectric material 20 is referred to herein as third dielectric material portion 20P. Collectively, each first dielectric material portion 14P, each second dielectric material portion 18P and each third dielectric material portion 20P may be referred to as a dielectric isolation structure.

Notably, FIG. 10 illustrates an exemplary semiconductor structure of the present application that includes a plurality of high mobility semiconductor material fins 16F located above and spaced apart from a bulk semiconductor substrate portion 10B, wherein each of the high mobility semiconductor material fins 16F has a lower faceted surface 16L that is confined within a dielectric isolation structure (14P, 18P, 20P). Notably, the lower faceted surface 16L is buried in the second dielectric material portion 16P of the dielectric isolation structure (14P, 18P, 20P).

Figure 11:
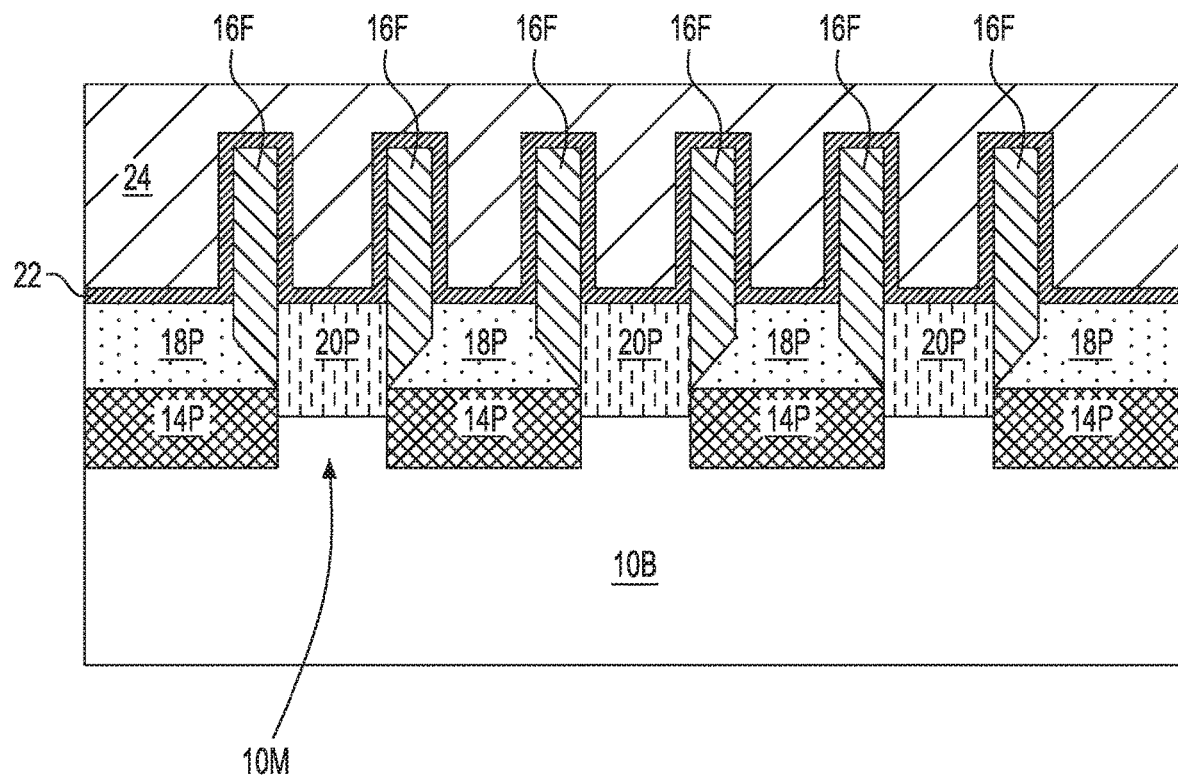
FIG. 11 is a cross sectional view of the exemplary semiconductor structure of FIG. 10 after forming a functional gate structure straddling each remaining high mobility semiconductor material structure.

Referring now to FIG. 11, there is illustrated the exemplary semiconductor structure of FIG. 10 after forming a functional gate structure (22, 24) straddling each remaining high mobility semiconductor material structure (i.e., each high mobility semiconductor material fin 16F). Although the present application describes and illustrates the formation of a single functional gate structure, a plurality of functional gate structures can be formed straddling different portions of each high mobility semiconductor material fin 16F. The term "straddling" denotes that the functional gate structure is formed across a high mobility semiconductor material fin 16F such that a first portion of each functional gate structure is present on one side of the high mobility semiconductor material fin 16F, and a second portion of each functional gate structure is present on another side of the high mobility semiconductor material fin 16F. As shown in FIG. 11, a portion of the functional gate structure is also located on a topmost surface of a portion of high mobility semiconductor material fin 16F.

By "functional gate structure" it is meant a permanent gate structure used to control output current (i.e., flow of carriers in the channel) of a semiconducting device through electrical or magnetic fields. Each functional gate structure that is formed includes a gate material stack of, from bottom to top, a gate dielectric portion 22 and a gate conductor portion 24. In some embodiments, a gate cap portion (not shown) can be present atop the gate conductor portion 24.

The gate dielectric portion 22 comprises a gate dielectric material. The gate dielectric material that provides the gate dielectric portion 22 can be an oxide, nitride, and/or oxynitride. In one example, the gate dielectric material that provides the gate dielectric portion 22 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric portion 22.

The gate dielectric material used in providing the gate dielectric portion 22 can be formed by any deposition process including, for example, chemical vapor deposition (CVD), plasma enhanced chemical vapor deposition (PECVD), physical vapor deposition (PVD), sputtering, or atomic layer deposition. In some embodiments and when multiple functional gate structures are formed, each gate dielectric portion 22 comprises a same gate dielectric material. In other embodiments and when multiple functional gate structures are formed, some of the gate dielectric portions may comprise a first gate dielectric material, while other gate dielectric portions may comprise a second gate dielectric material that differs in composition from the first gate dielectric material. When a different gate dielectric material is used for the gate dielectric portions, block mask technology can be used. In one embodiment of the present application, the gate dielectric material used in providing the gate dielectric portion 22 can have a thickness in a range from 1 nm to 10 nm. Other thicknesses that are lesser than, or greater than, the aforementioned thickness range can also be employed for the gate dielectric material.

The gate conductor portion 24 comprises a gate conductor material. The gate conductor material used in providing the gate conductor portion 24 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion 24 may comprise an nFET gate metal. In other embodiments, the gate conductor portion 24 may comprise a pFET gate metal. In yet other embodiments and when multiple functional gate structures are formed, some of the gate conductor portions comprise an nFET gate metal, while others gate conductor portions comprise a pFET gate metal.

The gate conductor material used in providing the gate conductor portion 24 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions, block mask technology can be used. In one embodiment, the gate conductor material used in providing the gate conductor portion 24 has a thickness from 1 nm to 100 nm. Other thicknesses that are lesser than, or greater than, the aforementioned thickness range can also be employed for the gate conductor material used in providing the gate conductor portion 24.

If present, the gate cap portion comprises a gate cap material. The gate cap material that provides each gate cap portion may include one of the dielectric materials mentioned above for hard mask material. In one embodiment, each gate cap portion comprises silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

Each functional gate structure can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

In other embodiments of the present application, at least one sacrificial gate structure is formed first and then replaced with a functional gate structure. By sacrificial gate structure" it is meant a material or material stack that serves as a placeholder for a subsequently formed functional gate structure. In such a process, the functional gate structure is formed after the source/drain structures have been formed. In such an embodiment, the gate dielectric portion of the functional gate structure may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portion 22. The sacrificial gate material portion includes one of the gate conductor materials mentioned above for gate conductor portion 24. The sacrificial gate cap portion includes one of the gate cap material mentioned above for gate cap portions. The sacrificial gate structures can be formed by deposition of the various material layers and then patterning the resultant sacrificial material sack by utilizing, for example, lithography and etching.

After forming the gate structure (functional or sacrificial gate structure) source/drain regions (not) can be formed utilizing an epitaxial growth process from exposed portions of each high mobility semiconductor material fin 16F that are not protected by a gate structure; the source/drain regions would by located within a plane that runs into and out of the drawing illustrated in FIG. 11. The source/drain regions comprise any semiconductor material including, for example, silicon germanium alloys or III-V compound semiconductors. The semiconductor material that provides the source/drain regions is doped with an n-type dopant or a p-type dopant as are well known those skilled in the art. The doping may be achieved during the epitaxial growth of the semiconductor material that provides the source/drain regions or after epitaxial growth of an intrinsic semiconductor material by utilizing ion implantation or gas phase doping.

In some embodiments, and prior to formation of the source/drain regions, a gate spacer (also not shown) can be formed on exposed sidewalls of the gate structure. The gate spacer can be formed by deposition of a gate spacer material, such as, for example, a dielectric oxide, and then etching the deposited gate spacer material by utilizing a spacer etch.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a plurality of high mobility semiconductor material fins located above and entirely spaced apart from a bulk semiconductor substrate portion, wherein each of the high mobility semiconductor material fins has a lower faceted surface that is confined within a portion of a dielectric isolation structure that comprises a first dielectric material portion located on a surface of the bulk semiconductor substrate portion, a second dielectric material portion located on a topmost surface of the first dielectric material and one side of each high mobility semiconductor material fin, and a third dielectric material portion located on another side of each high mobility semiconductor material fin and having a sidewall surface directly contacting an upper sidewall surface of the first dielectric material portion.

2. The semiconductor structure of claim 1, wherein the lower faceted surface is buried in the second dielectric material portion.

3. The semiconductor structure of claim 1, wherein the third dielectric material portion is present on an entirety of a topmost surface of a semiconductor mesa surface of the bulk semiconductor substrate portion.

4. The semiconductor structure of claim 1, wherein the bulk semiconductor substrate portion is composed of silicon, and each of the high mobility semiconductor material fins is composed of a silicon germanium alloy or a III-V compound semiconductor.

5. The semiconductor structure of claim 1, wherein each high mobility semiconductor material fin has a defect density of less than 100 defects per square centimeter.

6. The semiconductor structure of claim 1, wherein the second dielectric material portion comprises a doped oxide.

7. The semiconductor structure of claim 1, wherein a first sidewall surface of each high mobility semiconductor material fin has a length that is greater than a length of a second sidewall surface of each high mobility semiconductor material fin, the second sidewall surface is opposite the first sidewall surface.

8. The semiconductor structure of claim 7, wherein the first sidewall surface of each high mobility semiconductor material fin is vertically aligned to a sidewall surface of a semiconductor mesa surface of the bulk semiconductor substrate portion.

9. The semiconductor structure of claim 1, wherein a fin pitch between each neighboring pair of high mobility semiconductor material fins of the plurality of high mobility semiconductor material fins 30 nm or less.

10. The semiconductor of claim 1, wherein each high mobility semiconductor material fin has an entirely planar topmost surface, a first vertical sidewall, and a second vertical sidewall wherein the first vertical sidewall has a different length than the second vertical sidewall.

11. The semiconductor structure of claim 1, wherein the lower faceted surface of each high mobility semiconductor fin directly contacts a surface of the dielectric isolation structure.

12. The semiconductor structure of claim 1, wherein the first dielectric material portion, the second dielectric material portion, and the third dielectric material portion are composed of a same dielectric material.

13. The semiconductor structure of claim 1, wherein each of the first dielectric material portion, the second dielectric material portion, and the third dielectric material portion is composed of a different dielectric material.

14. The semiconductor structure of claim 1, further comprising a functional gate structure straddling over, and directly contacting an upper portion of each high mobility semiconductor material fin.

15. The semiconductor structure of claim 14, wherein the functional gate structure includes a gate dielectric portion that directly contacts sidewalls and a topmost surface of each of the high mobility semiconductor material fins and a topmost surface of the dielectric material structure.

16. A semiconductor structure comprising:
a plurality of high mobility semiconductor material fins located above and entirely spaced apart from a bulk semiconductor substrate portion, wherein each of the high mobility semiconductor material fins has a lower faceted surface that is confined within a portion of a dielectric isolation structure, and a first sidewall surface having a length that is greater than a length of a second sidewall surface of each high mobility semiconductor material fin, the second sidewall surface is opposite the first sidewall surface, and wherein the dielectric isolation structure comprises a first dielectric material portion located on a surface of the bulk semiconductor substrate portion, a second dielectric material portion located on a topmost surface of the first dielectric material and one side of each high mobility semiconductor material fin, and a third dielectric material portion located on another side of each high mobility semiconductor material fin and having a sidewall surface directly contacting an upper sidewall surface of the first dielectric material portion, and wherein the lower faceted surface is buried in the second dielectric material portion.

17. The semiconductor structure of claim 16, wherein the third dielectric material portion is present on an entirety of a topmost surface of a semiconductor mesa surface of the bulk semiconductor substrate portion.

18. The semiconductor structure of claim 16, further comprising a functional gate structure straddling over, and directly contacting an upper portion of each high mobility semiconductor material fin.

* * * * *